United States Patent [19]

Ikeda et al.

[11] 4,292,388

[45] Sep. 29, 1981

[54] IMAGE-FORMING MATERIAL OF ALUMINUM-IRON ALLOY

[75] Inventors: Tomoaki Ikeda; Masamiti Sigyoo; Sadaharu Ikeda; Satoshi Yoshida; Takeshi Tomotsu, all of Asaka, Japan

[73] Assignee: Fuji Photo Film Co., Ltd., Minami-ashigara, Japan

[21] Appl. No.: 960,547

[22] Filed: Nov. 14, 1978

Related U.S. Application Data

[63] Continuation of Ser. No. 685,571, May 12, 1976, abandoned.

[30] Foreign Application Priority Data

May 12, 1975 [JP] Japan ................................. 50-56552

[51] Int. Cl.$^3$ ............................................... G03C 1/94
[52] U.S. Cl. ................................. 430/162; 156/659.1; 156/665; 430/165; 430/5; 430/278; 430/321; 430/323; 430/526
[58] Field of Search .................. 96/35, 36, 36.2, 36.3, 96/86 R, 86 P; 156/659, 665; 430/323, 524, 526, 278, 165, 162, 5, 321

[56] References Cited

U.S. PATENT DOCUMENTS

| 2,965,457 | 12/1960 | Mathre | 156/665 |
| 3,356,550 | 12/1967 | Stiffler et al. | 156/665 X |
| 3,607,484 | 9/1971 | Marukawa et al. | 156/665 X |
| 3,715,250 | 2/1973 | Altman et al. | 156/665 X |
| 3,960,560 | 10/1974 | Sato | 96/36 |
| 4,008,084 | 2/1977 | Ikeda et al | 96/35 |
| 4,098,712 | 7/1978 | Ikeda et al. | 156/659 X |
| 4,124,516 | 11/1978 | Shinozaki et al. | 252/79.2 |

Primary Examiner—Edward C. Kimlin
Attorney, Agent, or Firm—Sughrue, Mion, Zinn, Macpeak and Seas

[57] ABSTRACT

A metal image-forming material comprising a base, a photosensitive resin layer formed thereon, and a layer of an aluminum/iron alloy formed between the base and the resin layer. The aluminum/iron alloy layer has superior etchability, and the image-forming material affords images having high contrast and resolving power. The image-forming material is especially suitable for linework and dot etching.

14 Claims, 2 Drawing Figures

IMAGE-FORMING MATERIAL OF ALUMINUM-IRON ALLOY

This is a continuation of application Ser. No. 685,571 filed May 12, 1976, now abandoned.

BACKGROUND OF THE INVENTION

1. Field of the Invention

This invention relates to a new material for forming a metal image, specifically, to a metal image-forming material which has the ability to form an image of high contrast, and is suitable for linework and halftone dot images.

2. Description of the Prior Art

An image-forming material called a chrome mask, which consists of a glass sheet, a chromium layer formed thereon by vacuum deposition, and a photosensitive resin layer on top of the chromium, is known. With this image-forming material, the cured resin layer after exposure and development becomes an etching resist, and by etching removal of the chromium layer a master print board for integrated circuits is produced. Since chromium is used in this image-forming material, images formed thereon are tough, but etching at the time of image formation is difficult. Furthermore, environmental pollution due to chromium ions dissolved in the etching solution poses a serious problem.

Japanese Patent Publication (OPI) Nos. 65927/73 and 65928/73 disclose an image-forming substance which is a vacuum deposited coating of a composition containing tellurium. Tellurium, however, is available only in small amounts, and is toxic.

Considering the above factors, aluminum is considered to be a desirable image-forming metal substance. The greatest defect of aluminum is that aluminum is difficult to etch with an etching solution of a simple composition. Because of this, long periods of time are usually required for etching, and, therefore, a material having strong resistance to etching must be used as an etching resist. In addition, it is difficult to obtain sharp, clear images, and their edges blur.

In an attempt to solve these problems with conventional techniques, we have investigated the etchability of aluminum (which is a non-toxic image-forming substance) in an image-forming material. These investigations led to the present invention.

SUMMARY OF THE INVENTION

According to the present invention, there is provided a metal image-forming material comprising a base, a photosensitive resin layer formed thereon, and a layer of an alloy of aluminum and iron formed between the base and said resin layer.

DETAILED DESCRIPTION OF THE INVENTION

Figure 1:
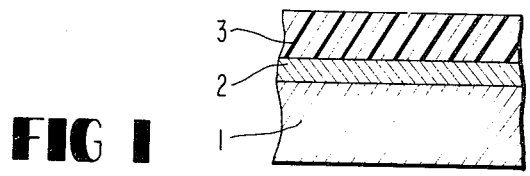
FIG. 1 is a sectional view showing the layer structure of an image-forming material of this invention.

Referring to FIG. 1, an aluminum/iron alloy layer 2 is formed on a base 1, and a photosensitive resin layer 3 is formed on top of it. Additional constituent elements may be formed in the image-forming material of this invention, if desired. For example, the invention includes an embodiment wherein an undercoat layer or intermediate adhesive layer is provided between various layers formed on the base, for example, between the base and the aluminum/iron alloy layer, or between the aluminum/iron alloy layer and the photosensitive resin layer, and an embodiment wherein a protective layer, for example, is further formed on the photosensitive resin layer. For example, an undercoating layer can be provided on a base by sputtering a metal such as silver, palladium, aluminum, etc., to improve the adhesion of the aluminum/iron alloy layer to the base. Examples of intermediate adhesive layers include, for example, rosin, abietic acid, etc. Examples of protective layers include, for example, a layer containing a higher fatty acid having at least 12 carbon atoms such as, for example, lauric acid, myristic acid, stearic acid, behenic acid, melissic acid, and the like, in combination with an alcohol-soluble nylon.

In any of these embodiments, the aluminum/iron alloy layer is present between the base and the photosensitive resin layer.

The aluminum/iron alloy layer which is most characteristic of the present invention will now be described in detail. The thickness of the aluminum/iron alloy layer is determined according to the optical density required for the resulting image area. Where the image is a line image or a dot image, the optical density should be relatively high. The optical density should be at least about 2.0, and, when the metal image-forming material of this invention is used as a mask for printing on a plate-making material, such as a PS plate, an optical density of about 3.0 is required. For most commercial applications, seldom will a maximum optical density greater than about 6 be required, and, hence, for practical purposes this can be considered the maximum preferred optical density. Generally speaking, though this is not to be construed as limitative, the aluminum/iron alloy layer is conveniently from about 300 Å to about 1500 Å thick, for most uses.

On a commercial scale, good results are obtained in accordance with the present invention when the aluminum/iron alloy layer comprises from about 0.2 to about 10 atomic % iron, more preferably from 0.3 to 7 atomic % iron, in combination with from about 99.8 to about 90 atomic % aluminum, more preferably from 99.7 to 93 atomic % aluminum. It is to be noted, in this regard, that when an aluminum/iron alloy layer is formed by a vacuum deposition or sputtering, the iron content thereof differs somewhat from that of the evaporation or sputtering source. In general, the iron content of the aluminum/iron alloy layer is less than that of the source; given this general criterion, one skilled in the art can easily determine the optimum source iron percentage.

Figure 2:
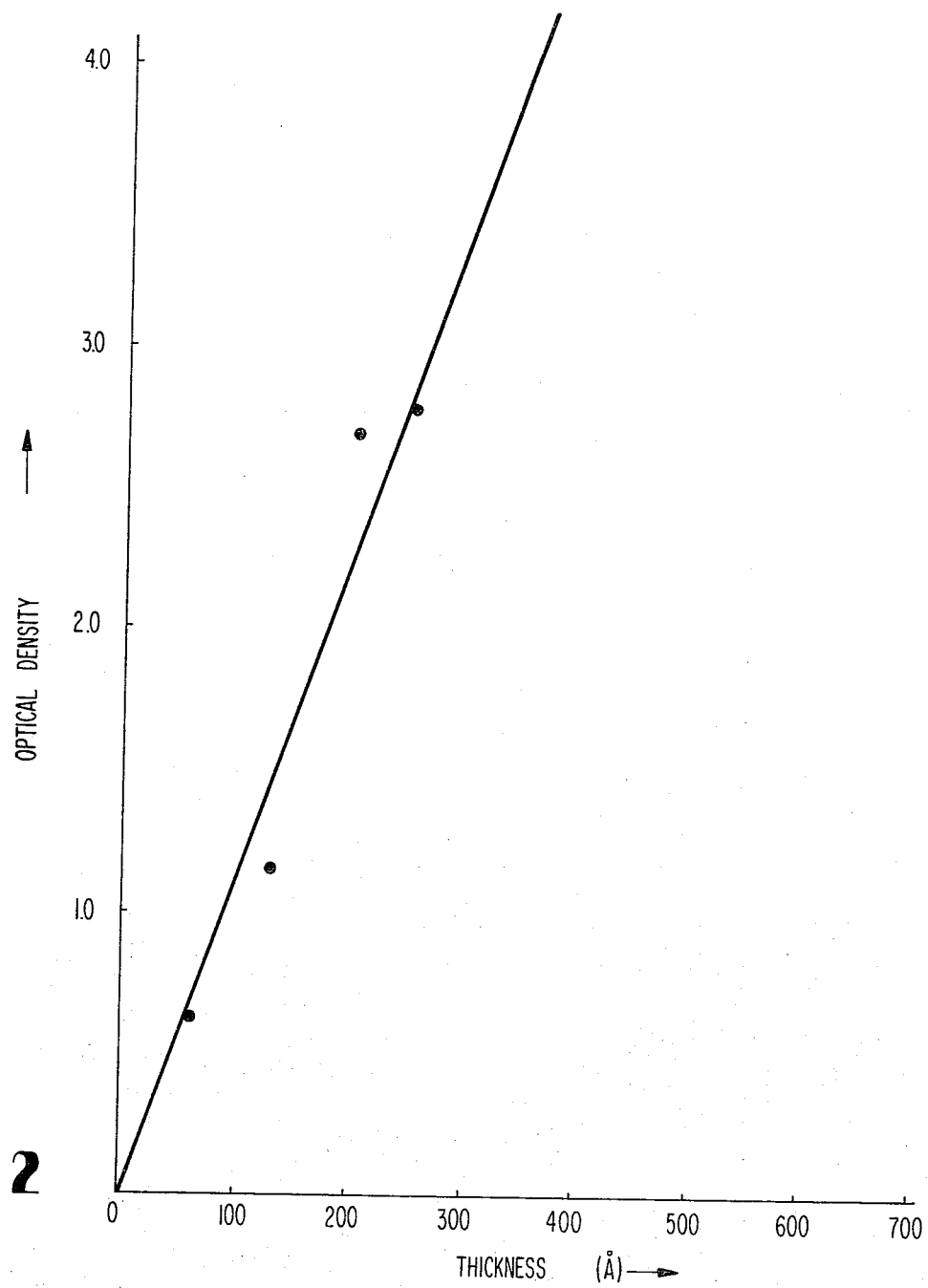
FIG. 2 is a graph showing the relationship between the thickness of a vacuum deposited layer of an aluminum-iron alloy in one example of an image-forming material of this invention and the optical (diffuse) density of the alloy layer (transmission density determined by scattering visual light through a slit having a slit size of 3ϕ).

FIG. 2 shows the relationship between the thickness of the vacuum deposited coating of the aluminum/iron alloy and the optical density thereof obtained from experimental values. Since such relationship generally changes according to the vacuum deposition conditions, it cannot be unequivocally determined. But, from FIG. 2, it can be seen that in order to obtain an optical density of 2.0, a coating thickness of about 400 Å is required, and that in order to obtain an optical density of 3.0, a coating thickness of about 600 Å is required.

For ease of processing, when a continuous vacuum deposition is conducted, i.e., a web is passed in a continuous manner through the vacuum deposition apparatus, typically the web is fed at a speed of 30 m/min and a deposition rate of around 1000 Å/sec is used, whereas when vacuum deposition is conducted upon a stationary web (sheet), a vacuum deposition rate of around 40 Å/sec is used. As one skilled in the art will appreciate, these values are not limitative, but are conveniently used.

In this manner, the thickness of the aluminum/iron alloy layer is rendered sufficient for a particular use of the resulting image-forming material. It is, of course, possible to increase the thickness beyond the required sufficient thickness, but such thicknesses as will necessitate excessively long periods of time for etching in image-formation should be avoided. If long periods of time are required for etching, the photosensitive resin layer as the resist is likely to be attacked by the etching solution.

In the present application, a vacuum deposition is generally described as the means for forming the aluminum/iron alloy layer. Other methods for forming thin coatings include sputtering, ion plating, electrodeposition, electrophoresis, vapor phase precipitation, and metal spraying; all of these can, of course, be used if they result in the desired aluminum/iron alloy layer. See L. I. Maissel, R. Glang: *Handbook of Thin Film Technology*, (McGraw-Hill, 1971, New York).

As will be understood from the above description of the various embodiments, the base on which to form the aluminum/iron alloy layer, and which supports the aluminum/iron alloy layer formed thereon as an image-forming layer either directly or indirectly through another layer, may be of various kinds according to the uses of the image-forming materials of this invention obtained by using the alloy layer. The base material is conveniently in the form of a plate, sheet or film when it is intended for use in those many uses requiring such image-forming materials, as will be obvious to one skilled in the art. Depending upon the uses, the base material may be transparent, translucent, or non-transparent. Furthermore, the base material should not be attacked by the etching solution used for etching the aluminum/iron alloy layer, and should not deteriorate in its adhesion to the layer thereon causing the layer to be stripped off or rendering it readily strippable during etching.

Many raw materials, such as ceramics and porcelain, amorphous glass, crystalline glass, metals, alloys, plastics, and composites thereof are known, and these can be used for the base. These materials include non-transparent or transparent materials. If desired, the transparent materials may be rendered translucent or non-transparent by adding a coloring agent or other agent to render them non-transparent. In many conceivable uses, the image-forming material of this invention is used as a "light-transmission type" material which is obtained by forming an image from the aluminum/iron alloy layer. Light is allowed to pass through the non-image areas where the aluminum/iron alloy layer is absent and the base is exposed, and the image areas are shielded from light by the aluminum/iron alloy layer. In these cases, it is necessary that the base be transparent. On the other hand, in areas where the images formed are perceived by reflected light, the base of the image-forming material need not be transparent.

The photosensitive resin layer formed on top of the aluminum/iron alloy layer can be formed utilizing various known resist-forming photosensitive resins. In general, there is no special criticality attached to the photosensitive resin selected for any particular metal image-forming material in accordance with the present invention, so long as the photosensitive resin can be selectively removed following image-wise exposure in a reasonable period of time and can withstand the etching solution utilized for the aluminum/iron alloy layer, at least in areas which are to remain. In this regard, it is to be noted that the etching solution most conveniently used for the aluminum/iron alloy layer is preferably a solution having a pH of about 12 or more and containing a conventional oxidizing agent. When a positive photosensitive layer (not of the peeling type) is used, the positive photosensitive layer at exposed areas can be easily be dissolved by such a etching solution. Therefore, it is possible to process (develop and etch) with one bath when such an embodiment is utilized. On the other hand, using a negative photosensitive layer (not of the peeling type) which can be dissolved in unexposed area by an organic solvent, this type of photosensitive image-forming material can be subjected to one bath processing using an etching solution containing an organic solvent therefore.

These photosensitive resins include all compounds and compositions, such as monomers, prepolymers and polymers, which, when exposed to radiation, chemically change in their molecular structure within a short period of time, and thereby in their physical properties such as solvent solubility or tackiness. While the definition of "photosensitive resins" has not yet been firmly established in the art, it is common knowledge in the art that a photosensitive resin embraces the above mentioned monomers or prepolymers, as is described, for example, in the Japanese publication entitled Photosensitive Resins: Vol. 33 of Industrial Technology Library by Tatsuo Warashina et al., published on Feb. 21, 1972 by Nikkan Kogyo Shinbun Sha.

Photosensitive resins can be classified roughly into two groups according to their mode of development, i.e., the solvent dissolving type and the peeling type. Each of these groups can be divided into the positive type and the negative type. Furthermore, they can be classified according to their chemical changes into photocrosslinkable photosensitive resins which, when exposed to radiation, crosslink through a metallic ion, or dimerize by themselves; photosensitive resins in which, upon exposure to radiation, a photodecomposable substance therein is decomposed, and which therefore crosslink through the decomposition product; and photosensitive resins which, when exposed to radiation, begin to polymerize. Any of these resins can be used for producing the image-forming materials of this invention. There are many known photosensitive resins which belong to the above classifications, but, needless to say, all photosensitive resins capable of forming a photosensitive resist coating which will come into existence in the future can be equally applied to the metal image-forming materials of this invention, irrespective of their classification.

In actual use of the photosensitive resins, classification thereof is preferably made according to their mode of development rather than according to their chemical changes. Photosensitive resins of the positive type capable of forming a solvent soluble layer decompose upon exposure to light, as in the case of quinone diazides, to form five-membered cyclic compounds containing a carboxyl group, and become soluble in alkaline solutions. The exposed resin layer is removed by washing with an alkaline solution, and the unexposed areas of the photosensitive resin layer remain thereon, forming the desired image areas. Negative type photosensitive resins of this kind, when exposed to light, become insoluble as a result of forming macromolecules or a network structure, as is seen in the case of photocrosslinking represented by, for example, a cinnamoyl or diazo group, and photopolymerization represented by, for example, an acrylamide or an acrylic acid ester. The unexposed areas of the photosensitive layer are removed by using a suitable developing solution, and the exposed, insoluble areas remain thereon forming the desired image areas.

These solvent-soluble photosensitive resins are widely utilized as photosensitive solutions for PS plates, wipe-on plates and as photoetching resists. Of course, those available as photosensitive solutions are limited to those for wipe-on plates and for photo-etching resists.

1,2-Naphthoquinone diazides can be used as positive-type photosensitive resins, and examples include the 2,3,4-trihydroxybenzophenone-bis[naphthoquinone-1,2-diazide-5,5-sulfonic acid esters] disclosed in Japanese Patent Publication 18015/62, the 2-[naphthoquinone-1,2-diazide-5-sulfonyloxy]-hydroxy-7-naphthalenes disclosed in Japanese Patent Publication No. 3627/62, naphthoquinone-1,2-diazide-5-sulfanilide as disclosed in Japanese Patent Publication 1954/62, and naphthoquinone-1,2-diazide-5-sulfonic acid novolac esters as disclosed in Japanese Patent Publication 9610/70. Commercially available useful products include, for example, KPR (type 3) (a product of Eastman Kodak Co.), AZ-340, AZ-1350, AZ-111 and AZ-119 (products of Azoplate-Shipley Company), Photosol, Photosol B and Photosol E (products of Tokyo Oka Kogyo K.K.), and EPPR-300, EPPR-700 and EPPR-1000 (products of Fuji Chemical Co., Ltd.).

On the other hand, many photosensitive substances, such as diazonium salts, azide compounds and compounds containing a cinnamoyl group, are useful as negative type photosensitive resins. Examples of the diazonium salts are a paraformaldehyde condensate of p-diazodiphenylamine, and the 1-diazo-4-dimethylaminobenzene-hydrofluoborate, 1-diazo-3-methyl-4-dimethylaniline.sulfate and 1-diazo-3-monoethylnaphthylamine as disclosed in U.S. Pat. No. 1,762,033. Examples of useful azide compounds are p-phenylene/-bisazide, p-azidobenzophenone, 4,4'-diazidobenzophenone, 4,4'-diazidodiphenylmethane, 4,4'-diazidostilbene, 4,4'-diazidechalcon, 2,6-bis(p-azidobenzal)cyclohexanone and 2,6-bis(p-azidobenzal)-4-methylcyclohexanone as disclosed, for example, in U.S. Pat. Nos. 2,852,379 and 2,940,853. These azide compounds are usually mixed with a rubber solution and used as a rubber photosensitive solution. Useful rubbers include natural and synthetic rubbers, and as is disclosed in Japanese Patent Publication No. 22084/70, a polyisoprene is most frequently used as the synthetic rubber.

Examples of useful polymers containing an azide group in the molecule are polyazide vinyl benzoate, polyazide vinyl phthalate, and polyvinylazide benzal acetal as disclosed, for example, in Japanese Patent Publications Nos. 28499/65 and 22085/70.

Examples of useful photosensitive resins containing a cinnamoyl group as a photosensitive group are polyvinyl cinnamate, which is most frequently used, and cinnamylidene acetic acid ester derivatives of polyvinyl alcohol such as polyvinyl cinnamylidene acetate, polyvinyl cinnamate-cinnamylidene acetate, polyvinylcarbethoxymethylcarbamate cinnamylidene acetate, and polyvinyl acetate cinnamylidene acetate.

Other negative type photosensitive resins useful in this invention containing an acryloyl group, acrylamide or acrylate are also known, and commercially available. For Example, KPR, KTFR and KMER (products of Eastman Kodak Co., U.S.A.), Western Wipeon (a product of Western Lithoplate Company, U.S.A.), Wipe-O-Sensitizer (a product of Litho Chemical & Supply Company, U.S.A.), E.P.P.R., OMR and TPR (products of Tokyo Oka Kogyo K.K.), Negacoat and Fuji Super Resist (products of Fuji Chemical Co., Ltd.), Wipedol and Resist S (products of Okamoto Kagaku Kogyo K.K.), and KY Resist (a product of Yamatoya Shoten).

Various types of compounds and compositions can be used as photosensitive resins forming a peelable layer. For example, as disclosed in Japanese Patent Publications Nos. 9663/63, 15932/66, 22901/68, and 43126/73, and Japanese Patent Publications (OPI) 7728/72, 33623/72, 58909/73 and 10117/73, they include photosensitive polymers in which, upon exposure to light, the adhesiveness of the exposed or unexposed areas to an aluminum/iron alloy layer adjacent to the base is reduced or lost, and photosensitive monomers which upon exposure to light polymerize and cure whereby their adhesion to the under layer is increased, reduced, or lost. In actual use, they are properly chosen according to their characteristics.

These photosensitive resins are usually combined with other ingredients, and used in the form of a liquid or solid composition. The liquid composition is coated on the aluminum/iron alloy layer formed on the base or on an intermediate auxiliary layer formed on top of it, and dried. Drying is conveniently performed at atmospheric pressure in the air at a temperature on the order of 80° to 120° C.; it is conveniently completed in as little as 1 minute and generally no more than 5 minutes is required. A solid composition, usually fabricated into a film form, is similarly superimposed on such a layer, and bonded thereto by heating, if necessary. A solid composition in other forms can be dissolved in an organic solvent and coated from the resulting solution. The photosensitive resin layer can be formed by any known techniques. For example, when the photosensitive resin layer is desired to be formed into a very thin coating, it is desirable to use a high-speed rotary coater called a "Whirler", which is adapted to perform coating while rotating the material to be coated at high speeds.

When photosensitive resins of the peeling type are used, a transparent transfer peel material is usually superimposed in intimate contact on the photosensitive resin layer in order to facilitate the peeling operation, or, as will be described hereinbelow, a transfer peel material can be superimposed in intimate contact on the photosensitive resin layer after image-wise exposure.

Though not to be construed as limitative, good results are generally obtained when a photosensitive layer having a thickness of from about $0.5\mu$ to about $5\mu$ is utilized.

For those photosensitive resins amenable to developing, conventional developing solutions are used, typically alkaline solutions, organic solvents or mixtures thereof, as will be obvious to one skilled in the art. Development is conveniently conducted at atmospheric pressure and at room temperature (15°–35° C.), and can generally be easily completed within about 10 seconds to about 3 minutes. While nothing would prohibit development at sub- or super-atmospheric pressures, no benefits are obtained by the use of such more complicated systems.

The image-forming material of this invention may be subjected to conventional treatments usually performed in the preparation of photographic materials; for example, an anti-halation layer or a protective layer may be formed on the image-forming material. Anti-halation layers as can be provided on the aluminum/iron alloy layer include those formed, for example, by the vacuum deposition of a sulfide represented by the formula $GeS_x$, wherein x is a positive integer of greater than 1, SnS and the like, or provided on the aluminum/iron alloy layer by coating a resin containing a black or red pigment or a dye therein.

Images can be formed on the image-forming material of this invention by image-wise exposing it using a mask having the desired image as an original to form in the photosensitive resin layer a latent image corresponding to the above image in the mask, developing the exposed material to dissolve and remove the readily soluble portions of the resin layer or removing the strippable portions by peeling after the image-wise exposure, dissolving and removing the aluminum/iron alloy layer by etching from the resulting exposed portions free from resist, and finally removing the resin layer present as a resist.

For example, the aluminum/iron alloy layer can be conveniently dissolved at atmospheric pressure and at room temperature (15°–35° C.) using a solution at a pH of the order of about 12 to about 13.5; the dissolution of the aluminum/iron alloy layer is easily effected in about 5 to about 30 seconds. Illustrative solvent systems for this dissolution/removal include an NaOH aqueous solution (0.4%–4% wt %); a $KBrO_3$, $NaClO_2$ or $NaClO_3$ etc., aqueous solution (1%–5% wt %); an $Na_3PO_4\cdot 12H_2O$ aqueous solution (1%–5% wt %), etc., though obviously the present invention is not limited to the same.

In order to expose the image-forming material image-wise through a mask original having the desired image, the photosensitive layer of the image-forming material is subjected in a darkroom to irradiation with light which has passed through a negative original or positive original, as is conventionally performed in photographic processing. Since many photosensitive resins have high sensitivity, especially to ultraviolet rays, suitable light sources for use in this case are a super high pressure mercury lamp, a xenon lamp, a carbon arc lamp, and a chemical lamp which emits large quantities of ultraviolet rays. A yellow color lamp can be used as an indoor safety lamp for processing, if desired. Exposure is conveniently performed at room temperature (15°–35° C.), and the time can vary greatly, depending upon the kind of light source used, the intensity, distance, and the like. However, usually exposure on a commercial scale is accomplished within about 20 seconds to about 1 minute. For instance, using a metal halide mercury lamp of 2 kW 1 meter from the element, exposure for 25 seconds is sufficient ($6.37 \times 10^4$ erg/cm$^2$ at the element surface). As will be obvious to one skilled in the art, the exact exposure conditions used can be varied greatly.

A latent image is formed in the photosensitive resin layer as a result of image-wise exposure. When the photosensitive resin is a solvent-soluble type, the resin layer in the unexposed areas remains insoluble in solvent but the exposed portions become readily soluble in the solvent (in the case of the positive type), or the resin layer in the unexposed portions is maintained soluble in the solvent but the exposed portions cure and become insoluble (in the case of the negative type). A latent image is formed due to the differences in solvent solubility between the exposed areas and the unexposed areas.

The solvent used in this invention may be water, organic solvents or a water/organic solvent mixed system. Generally, the exposed areas of a positive type photosensitive resin become soluble in alkali and the exposed portions of a negative type photosensitive resin become insoluble in water or organic solvents.

In order to develop the latent image, the latent image surface of the resin layer is contacted with a solvent in which the exposed portions and the unexposed portion are either soluble or insoluble. When commercially available photosensitive resins are used, developers designated by the manufacturers, are available, and therefore, such developers are used for development. In the case of the positive type, the photosensitive resin layer remains in the unexposed areas, and in the case of the negative type, the cured resin layer remains in the exposed areas to form image areas.

The aluminum/iron alloy layer is exposed to the non-image area at the dissolved portions. On the other hand, the latent image on the photosensitive resin layers of the peeling type is formed by a difference in the adhesion of the photosensitive resin layer to the layers adjacent thereto. Specifically, in the case of the positive type resin, the resin layer in the unexposed areas retains the property of having a higher adhesion strength to the aluminum/iron alloy layer formed on the base than to the peeling material formed on top of it, and the resin layer in the exposed portions has a larger adhesion strength to the former than the latter. In the case of a negative type resin, the resin layer in the unexposed portions retains the property of having a higher adhesive strength to the peeling-off sheet than to the aluminum/iron alloy layer or to an auxiliary layer formed on top of it, and the resin layer in the exposed layer has a higher adhesive strength to the latter than to the former. Accordingly, in order to develop this latent image, the peeling material adhering intimately to the photosensitive resin layer is stripped off from the photosensitive resin layer. After peeling, the photosensitive resin layer remains in the form of images on the aluminum/iron alloy layer or the auxiliary layer formed thereon, and forms a resist.

Examples of peeling-type photosensitive resin compositions include:

| MONOMER | BINDER |
| --- | --- |
| pentaerythritol trimethacrylic acid ester | chlorinated polyethylene |
| diglycerin trimethacrylic acid ester | chlorinated polyethylene |
| trimethylolpropane triacrylic acid ester | chlorinated polypropylene |
| pentaerythritol, acrylic acid, succinic acid ester (molar ratio 2:6:1) (plus) ethylene glycol acrylic acid, phthalic acid ester (molar ratio 2:2:1) | chlorinated polyethylene |
| polyethylene glycol (MW ca.400); acrylic | cellulose acetate |

| -continued | |
|---|---|
| MONOMER | BINDER |
| acid, trimellitic acid ester (molar ratio 3:3:1) (plus) tetraethylene glycol diacrylic acid ester | butyrate |

Needless to say, in addition to the above materials, photopolymerization initiators and/or solvents to ease the coating of the composition on a support or a base (substrate) can further be used, if desired. Typically, the solvent will be used, and such will be substantially completely removed by evaporation from the final product.

When the exposed aluminum/iron alloy layer is etched by dipping the image-forming material in an etching solution for the aluminum/iron alloy, the etched portions of the aluminum/iron alloy are removed to expose the surface of the base. On the other hand, the remaining resin layer serves as a resist to the etching; and the aluminum/iron alloy layer beneath these areas remains unetched to form image areas having an optical density determined according to the thickness of the aluminum/iron layer.

Both alkaline and acidic etching solutions can be used for the aluminum/iron alloy. Of course, both alkaline and acidic etching solutions are available for aluminum, but the aluminum/iron alloy layer exhibits a far more suitable etchability for the objects of this invention than an aluminum layer. Etchability, as referred to herein, means the time required for etching and the sharpness of etched portions. Shorter etching times have to do with better developability of the images, and sharpness at the edges of the etched portions is one requirement for obtaining good quality images. While not to be construed as limitative, preferred alkaline solutions exhibit a pH of from about 12 to about 13.5 and preferred acidic solutions exhibit a pH of less than about 2.

It is generally stated, with regard to the etching of aluminum, that with an oxidizing acid a chemically stable oxide coating is formed at room temperature on the surface of aluminum (the passive state), and, for this reason, the aluminum cannot be etched. The addition of iron to aluminum causes defects in the oxide coating, and prevents the conversion of aluminum to the passive state. Thus, the aluminum alloy layer of this invention shows good etchability, and an optically non-transparent thin coating of the alloy suitable for the objects of this invention can be obtained.

In order to etch sharply at the edges of a resist the etching must be carried out uniformly. From this viewpoint, the use of alkaline etching solutions is sometimes advantageous.

The above process consists of the two steps of exposing and developing the photosensitive resin to form etch resists, and then etching the exposed aluminum layer. As mentioned above, some of the photosensitive resins usable in the present invention can be developed with alkali after exposure. When such photosensitive resins are used, there can be used a single bath development-etching method in which an etching resin resist pattern is formed by developing the exposed photosensitive resin, and, simultaneously, the aluminum/iron layer is etched to form the desired images.

An aluminum/iron alloy and aluminum were separately coated on polyethylene terephthalate films by vacuum deposition to a thickness of about 600 Å. These materials were etched with an acid solution and an alkali solution, and the etchability of these materials determined. The results are tabulated below.

| Acid or alkali | Concentration (%) | Etching time | | Etched shape | |
|---|---|---|---|---|---|
| | | Al—Fe | Al | Al—Fe | Al |
| $H_2SO_4$ | 40 | 16' | 25' (could not be etched) | Good | — |
| HCl | 29 | 10'30"* | 25'** (liberated) | Good | Poor |
| | 14 | 18' | 20' (liberated) | Good | Poor |
| $H_3PO_4$ | 40 | 3' | 12' | Good | Good |
| | 20 | 5'30" | 19' | Good | Somewhat good |
| NaOH | 20 | 10.5" | 16" | Good | Good |
| | 10 | 26" | 60" | Good | Somewhat good |

*minutes, seconds
**layer peeled off

The above experimental results demonstrate that the etching of the aluminum/iron alloy is very uniform using any of the recited acid or alkaline etching solutions, and the edges of the etched portions were of good quality. These characteristics sufficiently meet one of the characteristics required of image-forming materials, and the etching time is shorter than in the case of etching aluminum.

The good etchability of the aluminum/iron alloy of the present invention is due to the fact that the conversion of aluminum to the passive state by the formation of an oxide coating is prevented by the iron, and may also be accounted for by a contact etching theory, i.e., it is well known that contact etching is influenced in a complicated way by, for example, the electric resistance and polarization characteristics of an electric cell circuit, and the area ratio of the contact metal and also by the environment. The well known phenomena that can be accounted for by such a contact etching theory are utilized in the present invention, and incorporated in the constituent elements of the image-forming material of the present invention as fully controllable elements. It is true that the image-forming material of this invention is commercially very useful.

Since the image-forming material of this invention contains the aluminum/iron alloy layer, it has a fixed optical density. Furthermore, in image formation, the etching of a photosensitive resin layer that develops superior resolving characteristics can be utilized. The resulting images, therefore, have a high level of contrast and resolving power. Accordingly, the image-forming material of the present invention is extremely suitable for linework in such applications as microfilms or lithographic films, and as photographic materials for halftone dots which require dot etching characteristics.

The following Examples further illustrate the present invention.

EXAMPLE 1

The necessary amount of $Al_2Fe$ alloy was placed in a tungsten boat disposed in a vacuum deposition apparatus (If desired, of course, other alloy sources such as $Al_2Fe$, $Al_5Fe_2$, $Al_3Fe$, $Al_{98.5}Fe_{1.5}$ and the like can be used with equal success). A polyethylene terephthalate film having a thickness of 100 microns was set in an arcuate form in the vacuum deposition apparatus so that its distance from the above evaporation source was about 30 cm. Vacuum deposition was performed at a vacuum of $5 \times 10^{-5}$ torr until a monitor (DTM-200 type, made by Sloan Instruments Corp.) indicated a film thickness of 600 Å had been obtained to form an aluminum/iron alloy film (to be referred to as a vacuum deposited film). The aluminum alloy layer contained 95.4 atomic % aluminum and 4.6 atomic % iron. Generally speaking, though this is not to be construed as limitative, the aluminum/iron alloy layer is conveniently from about 300 Å to about 1500 Å thick, for most uses.

AZ-1350: Positive Type Photoresist (trademark for a positive-type photosensitive resin, a product of Azoplate-Shipley Company, U.S.A.; it is believed this resin comprises a novalak type phenol resin plus ortho-quinone diazide) was coated on the resulting film in a darkroom by using a spinner at a speed of 5000 rpm, and dried to form an image-forming material of this invention. The dry thickness of the resulting photosensitive layer was 1.5μ

A positive original was intimately contacted with the image-forming material, and the assembly disposed 30 cm below a 250 W super high pressure mercury lamp, followed by exposure for 10 seconds. The exposed material was developed with an alkaline aqueous developer for AZ-1350 sold together with the photosensitive resin. Development was conducted at atmospheric pressure and at room temperature (23° C.) for 60 seconds. Resists of images corresponding to the positive original were formed in the photosensitive resin layer.

The film was then immersed at room temperature (23° C.) for 15 seconds in a solution prepared by dissolving 1 g of sodium hydroxide and 60 ml of sodium hypochlorite (available chlorine 5%) in 100 ml of distilled water. Thus, the aluminum layer in the non-image area free from resist was etched and removed. The resist was then removed to form a positive image of aluminum having the desired quality. The image obtained in this Example had an optical density of more than 3.0, and a resolving power of more than 100 lines/mm.

EXAMPLE 2

KPR-type 1 Negative-Type Photoresist (trademark for a negative type photosensitive resin, a product of Eastman Kodak, Co.; polyvinylcinnamate) was coated on a vacuum deposited film obtained following the procedure of Example 1 using a spinner at a speed of 3,000 rpm, and dried to form an image-forming material of this invention. The dry thickness of the resulting layer was 0.5–0.7 μ. A negative original was intimately contacted with the image-forming material, and the assembly was disposed 30 cm below a 100 W super high pressure mercury lamp, followed by exposure for 30 seconds. Then, the exposed material was developed with a developer for KPR-type 1 sold together with the above photosensitive resin (a xylene+methyl cellosolve acetate mixture). Development was at atmospheric pressure and at room temperature (23° C.) for 30 seconds. Thus, resists of positive images corresponding to the negative original were formed in the photosensitive resin layer.

The film was then immersed at room temperature (23° C.) for 15 seconds in an etching solution of the same composition as was used in Example 1. Thus, the aluminum/iron alloy layer in the non-image area free from the resists was etched and removed.

The optical density of the resulting product was 3.5 and the resolving power thereof was 350 lines/mm.

EXAMPLE 3

A photosensitive solution prepared by mixing a phenolic resin (a novalak type phenolic resin) and ortho-quinone diazide (mixed in a weight ratio of 2 parts of phenolic resin to 1 part of ortho-quinone diazide) and dissolving the mixture in methyl ethyl ketone was coated on a vacuum deposited film obtained by the same procedure as in Example 1 using a spinner at a speed of 4000 rpm and dried. A positive original was intimately contacted with the resulting image-forming material, and the material was exposed for 5 seconds using a 250 W super high pressure mercury lamp disposed at a distance of 30 cm from the film. The exposed material was immersed in a solution containing 60 ml of a sodium hypochlorite solution (available chlorine 5%), 40 ml of distilled water and 0.6 g of sodium hydroxide at room temperature (23° C.) to provide a positive image having good quality. The treating time was 20 seconds. The resulting image had an optical density of 3.0, and a resolving power of more than 100 lines/mm.

While the invention has been described in detail and with reference to specific embodiments thereof, if will be apparent to one skilled in the art that various changes and modifications can be made therein without departing from the spirit and scope thereof.

What is claimed is:

1. A metal image-forming material for line work and halftone dot images comprising a base, a resist-forming photosensitive resin layer formed thereon, said photosensitive resin layer comprising a monomer, a prepolymer or a polymer, which, when exposed to radiation, chemically changes in its molecular structure and thereby changes in its solvent solubility, and a layer ranging in the thickness from about 300 Å to about 1500 Å of an aluminum/iron alloy consisting essentially of aluminum and iron, said alloy containing from about 0.2 to about 10 atomic % of iron, formed between said base and said photosensitive resin layer said alloy being entirely removed in areas where exposed to an etching solution.

2. The metal image-forming material of claim 1 wherein said aluminum/iron alloy is formed by vacuum deposition.

3. The metal image-forming material of claim 1, wherein said base comprises a transparent high molecular weight material.

4. A metal image-forming material as claimed in claim 1 wherein said aluminum/iron alloy consists essentially of from 0.3 to 7 atomic % of iron and from 99.7 to 93 atomic % of aluminum.

5. The metal image-forming material of claim 1, wherein said photosensitive resin layer comprises a positive working photosensitive resin selected from the group consisting of quinone diazides and a mixture of quinone diazides and phenolic resins.

6. The metal image-forming material of claim 5, wherein said quinone diazide is a 1,2-naphthoquinone diazide selected from the group consisting of 2,3,4-trihydorxybenzophenone-bis[naphthoquinone-1,2-diazide-5,5-sulfonic acid esters], 2-[naphthoquinone-1,2-diazide-5-sulfonyloxyl]-hydroxy-7-naphthalenes, naphthoquinone-1,2-diazide-5-sulfanilide and naphthoquinone-1,2-diazide-5-sulfonic acid novolac esters.

7. The metal image-forming material of claim 1, wherein said photosensitive resin layer comprises a negative working photosensitive resin selected from the group consisting of a diazonium salt, an azide compound, a compound containing a cinnamoyl group, an acrylamide and an acrylic ester.

8. The metal image-forming material of claim 7, wherein said negative working resin is a diazonium salt and a member selected from the group consisting of paraformaldehyde condensate of p-diazodiphenylamine, 1-diazo-4-dimethyl-aminobenzene hydrofluoborate, 1-diazo-3-methyl-4-dimethylaniline sulfate and 1-diazo-3-monoethylnaphthylamine.

9. The metal image-forming material of claim 7, wherein said negative working resin is an azide compound and is a member selected from the group consisting of p-phenylenebisazide, p-azidobenzophenone, 4,4'-diazidobenzophenone, 4,4'-diazidodiphenylmethane, 4,4'-diazidostilbene, 4,4'-diazidochalcone, 2,6-bis(p-azidobenzal)cyclohexanone, 2,6-di-(4'-azidebenzal)-4-methylcyclohexanone, polyazide vinyl benzoate, polyazide vinyl phthalate, and polyvinylazide benzal acetal.

10. The metal image-forming material of claim 9, wherein said azide compound is used as a mixture with a natural or synthetic rubber solution.

11. The metal image-forming material of claim 7, wherein said negative working photosensitive resin is a compound containing a cinnamoyl group and a member selected from the group consisting of polyvinyl cinnamate, cinnamylidene acetic acid ester derivatives of polyvinyl alcohol, polyvinyl cinnamate-cinnamylidene acetate, polyvinylcarbethoxymethylcarbamate cinnamylidene acetate, and polyvinyl acetic cinnamylidene acetate.

12. The metal image-forming material of claim 1, wherein an undercoat layer or intermediate adhesive layer is provided between various layers formed on the base.

13. The metal image-forming material of claim 1, wherein a protective layer is formed on top of and is directly in contact with the photosensitive resin layer.

14. The metal image-forming material of claim 1, wherein the optical density of the aluminum/iron alloy layer is at least about 2.0.

* * * * *